United States Patent [19]
Reid et al.

[11] Patent Number: 5,749,614
[45] Date of Patent: May 12, 1998

[54] VACUUM PICKUP TOOL FOR PLACING BALLS IN A CUSTOMIZED PATTERN

[75] Inventors: Ellen Margaret Reid, Boca Raton, Fla.; Douglas Bruce Feicht, Phoenix, Ariz.; Dennis Brian Miller, Barrington, Ill.; Daniel Joseph Viza, Phoenix, Ariz.; Mark William McGarry, Tempe, Ariz.

[73] Assignee: Motorola, Inc., Schaumburg, Ill.

[21] Appl. No.: 567,012

[22] Filed: Dec. 4, 1995

[51] Int. Cl.⁶ .................................................... B25J 15/06
[52] U.S. Cl. ........................................................ 294/64.1
[58] Field of Search ................... 294/64.1, 65; 248/362, 248/363; 269/21

[56] References Cited

U.S. PATENT DOCUMENTS

| | | | |
|---|---|---|---|
| 2,572,640 | 10/1951 | Lovegrove | 269/21 X |
| 3,004,766 | 10/1961 | Bryant | 269/21 X |
| 3,390,447 | 7/1968 | Mears . | |
| 3,556,578 | 1/1971 | Meyers | 294/64.1 |
| 3,910,621 | 10/1975 | Hillier | 294/64.1 |
| 3,933,194 | 1/1976 | Hijikata et al. . | |
| 4,049,484 | 9/1977 | Priest et al. | 294/64.1 X |
| 4,786,662 | 11/1988 | Dewez | 294/65 X |
| 4,881,770 | 11/1989 | Marzinotto et al. | 294/64.1 |
| 4,892,296 | 1/1990 | Jelinek | 269/21 |
| 5,284,287 | 2/1994 | Wilson et al. . | |
| 5,445,313 | 8/1995 | Boyd et al. . | |

FOREIGN PATENT DOCUMENTS

| | | | |
|---|---|---|---|
| 3208864 | 9/1983 | Germany | 269/21 |
| 102848 | 5/1988 | Japan | 269/21 |
| 2120141 | 11/1983 | United Kingdom | 269/21 |

*Primary Examiner*—Johnny D. Cherry
*Attorney, Agent, or Firm*—Douglas D. Fekete; John B. MacIntyre

[57] ABSTRACT

A vacuum pickup tool (10) is effective to carry balls (18) arranged in a desired pattern. The vacuum pickup tool (10) includes a manifold (12) that includes a carrier plate (22) that has a plurality of manifold bores (28) arranged in a pattern. The manifold (12) defines a vacuum chamber (20) that reduces gas pressure in the manifold (12) to allow the manifold bores (28) to retain a ball (18). The manifold (12) further includes a retaining plate (14) that overlies the carrier plate (22) and includes a plurality of retaining plate bores (30) arranged in a pattern such that each retaining plate bore (30) registers with a corresponding manifold bore (28). The retaining plate (14) is effective to secure a stencil (16) formed of a gas-impermeable sheet against the carrier plate (22) to prevent gas flow between a manifold bore (28) and a corresponding retaining plate bore (30).

12 Claims, 3 Drawing Sheets

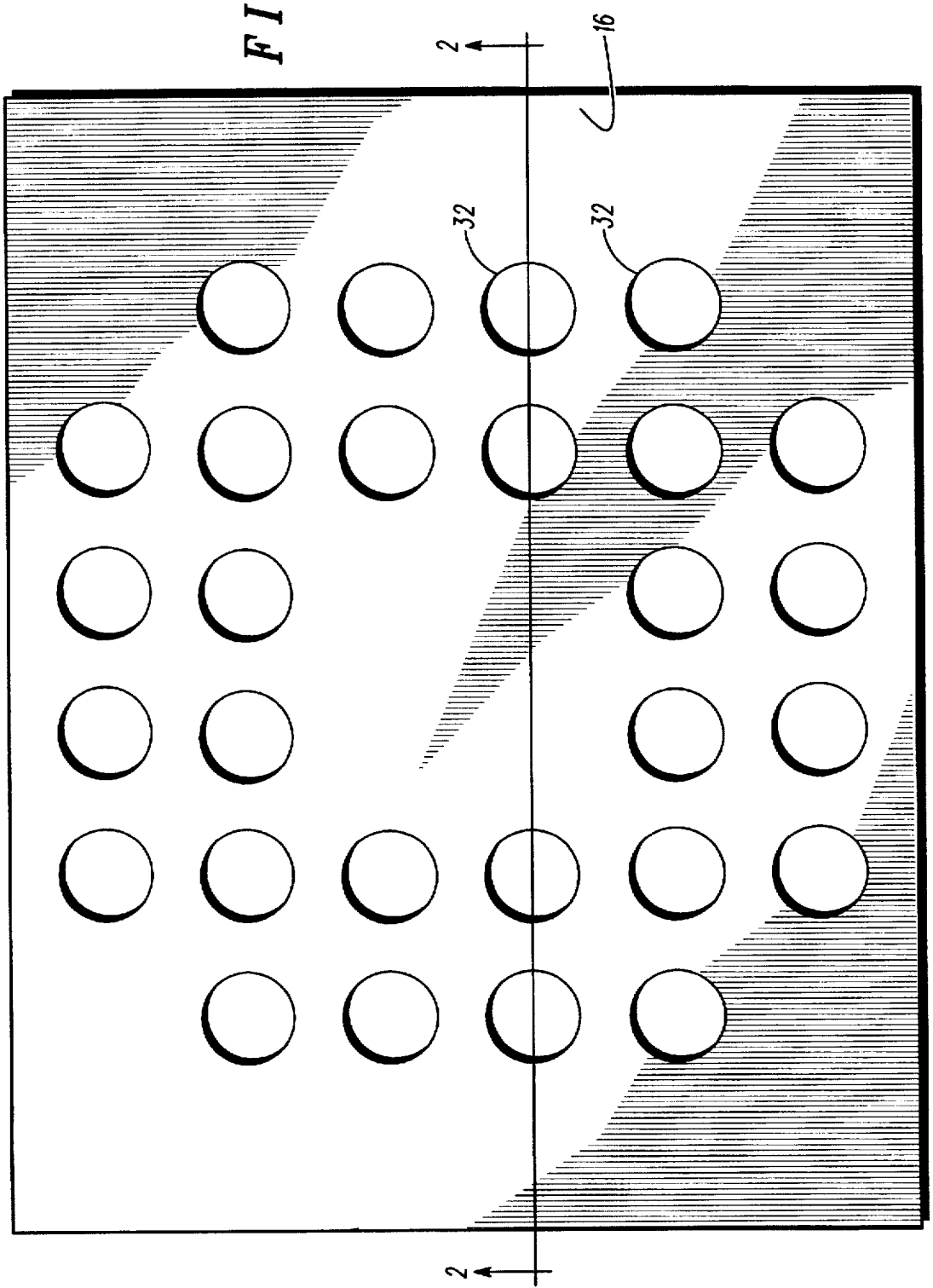

VACUUM PICKUP TOOL FOR PLACING BALLS IN A CUSTOMIZED PATTERN

FIELD OF THE INVENTION

This invention relates generally to a vacuum pickup tool for placing a multiplicity of balls in a pattern. More particularly, this invention relates to such a pickup tool that uses a stencil to block gas flow between registered bores to allow customization of the ball pattern.

BACKGROUND OF THE INVENTION

In order to minimize the size and weight of a microelectronic device, integrated circuit components have been directly attached to bond pads on printed circuit boards by solder bump interconnections. Solder bump interconnections are formed by superposing bond pads on a component with bond pads on a printed circuit board with solder bumps therebetween and reflowing the solder bumps to form the desired interconnections. The bond pads on the integrated circuit component must match the pattern of bond pads on the printed circuit board. For this reason, solder balls must be deposited onto the bond pads of a printed circuit board in a pattern that matches the bond pads on an attached integrated circuit component.

In certain microelectronic devices, the bond pads on the printed circuit board are arranged about the perimeter of the component. In other devices, an aperiodic array is formed, wherein no bond pad is found at certain sites of the component. In either case, solder balls must be deposited in a pattern that matches the pattern of bond pads on an integrated circuit component in order to effectively couple the component to the board.

It is known to use a vacuum pickup tool to pick up solder balls and concurrently place the balls in a desired pattern onto the bond pads of a printed circuit board. When the desired pattern changes, such as going from a perimeter array component to an aperiodic array component, the solder bump pattern must be changed. Consequently, the pickup tool requires a new pickup head that matches the new pattern. The manufacture of the pickup head to match the pattern of a new component array is expensive and leads to long changeover times to install the new pickup head.

Therefore, a need exists for a customizable vacuum pickup tool that is effective in picking up solder balls in a desired pattern and is effective to deposit them in the desired pattern onto a printed circuit board or the like. Also, a need exists for a customizable vacuum pickup head that permits rapid changeover from one pattern to another. Further, a need exists for an inexpensive and easy way to adapt a pickup tool to carry solder balls in a customizable pattern.

BRIEF DESCRIPTION OF THE DRAWINGS

FIG. 3 is a bottom plan view of a stencil in accordance with a preferred embodiment of the present invention.

DETAILED DESCRIPTION OF A PREFERRED EMBODIMENT

The present invention provides a vacuum pickup tool effective in picking up solder balls in a pattern, which, in a preferred embodiment, corresponds to an arrangement of bond pads on a substrate, such as a printed circuit board or a package substrate. The vacuum pickup tool includes a manifold that defines a vacuum chamber and includes a carrier plate that carries the balls. The carrier plate has a plurality of manifold bores, each sized and shaped to receive a solder ball. A retaining plate overlies the carrier plate and includes a series of retaining plate bores that register with the manifold bores. A gas-impermeable stencil is interposed between the carrier plate and the retaining plate and has a plurality of holes defined therein that form continuous gas passages between corresponding manifold bores and carrier plate bores that are in the pattern. The stencil prevents gas flow between manifold bores and retaining plate bores that are not part of the pattern. The stencil may be readily changed to modify the pattern of solder balls that are carried.

Figure 1:
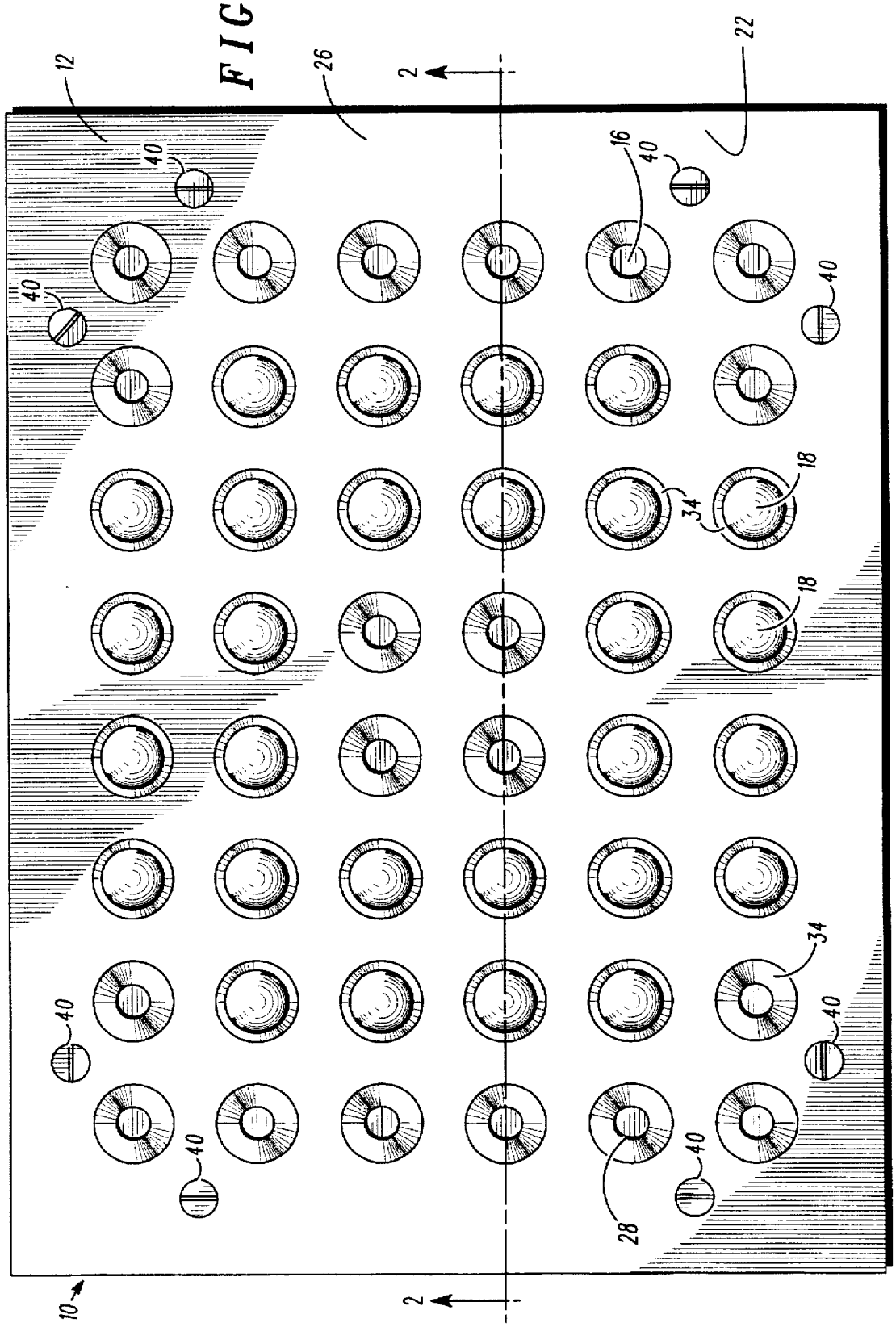
FIG. 1 is a bottom plan view of a vacuum pickup tool in accordance with a preferred embodiment of the present invention.
Figure 2:
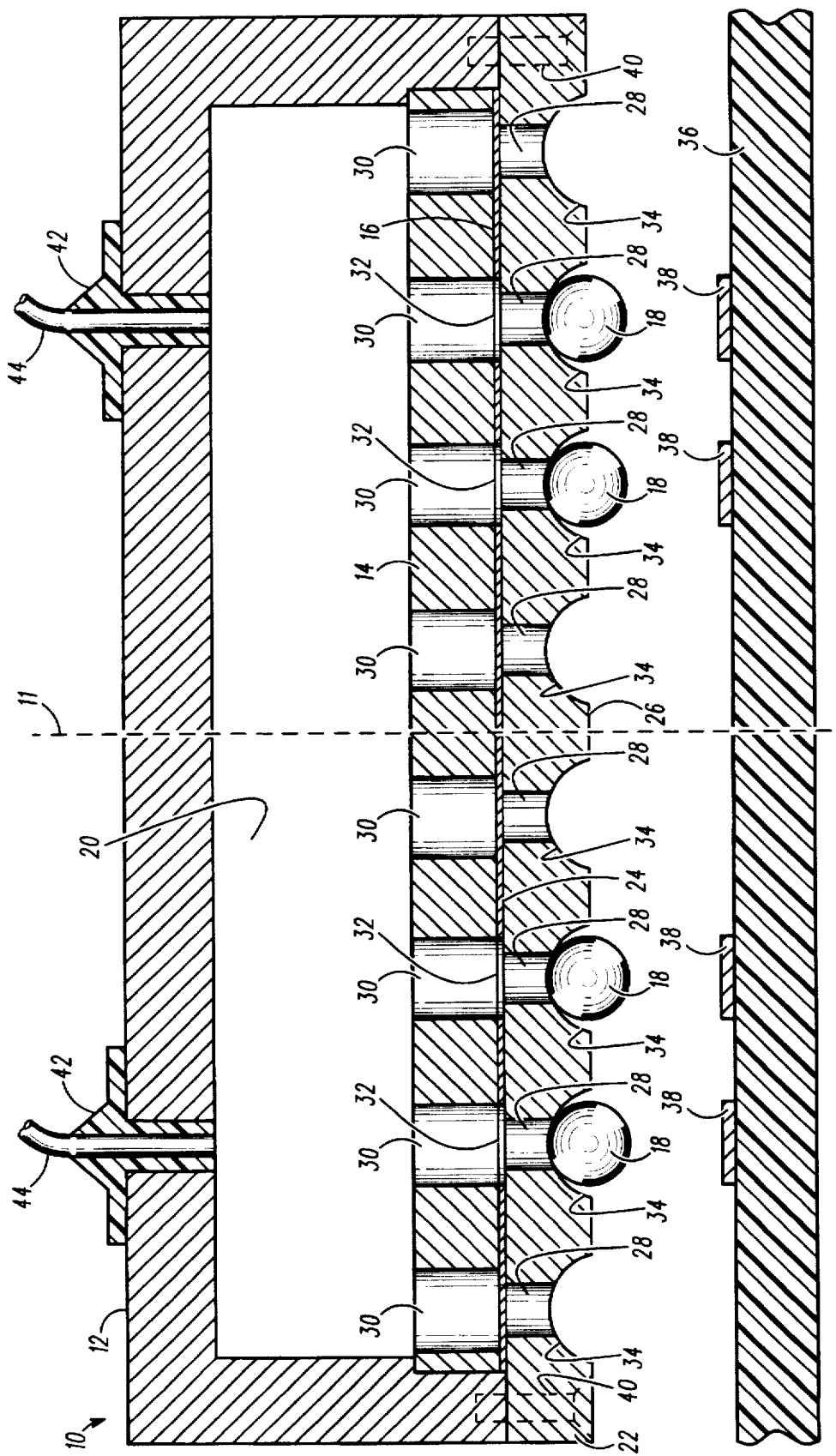
FIG. 2 is a cross-sectional view of the vacuum pickup tool in FIG. 1 taken along line 2—2.

The present invention can be further understood with reference to FIGS. 1 through 3. FIGS. 1 and 2 depict a preferred embodiment of a vacuum pickup tool 10 in accordance with the present invention. Vacuum pickup tool 10 is effective in picking up a plurality of solder balls 18 in a preferred pattern and placing them onto bond pads 38 on printed circuit board 36 depicted in FIG. 2. Typical solder balls 18 have a diameter greater than about 0.5 millimeters and are commercially available. Vacuum pickup tool 10 comprises a manifold 12 that defines vacuum chamber 20. Manifold 12 comprises a carrier plate 22 that includes an inner face 24 and an outer face 26 opposite inner face 24. In a preferred embodiment, inner face 24 and outer face 26 are planar and parallel. Axis 11 is defined to be perpendicular to inner face 24 and outer face 26. A series of manifold bores 28 are axially formed in carrier plate 22 and extend axially between inner face 24 and outer face 26. Manifold bores 28 are formed in a regular array and are sized and shaped to retain balls 18. In a preferred embodiment, manifold bores 28 have a concave seat 34 that is sized and shaped to receive a solder ball 18. Manifold bores 28 have a diameter less than the diameter of solder balls 18. By way of an example of a preferred embodiment, manifold bores 28 have a diameter of about 0.37 millimeters. Balls 18 are lodged against seat 34 and are drawn from a container of loose solder balls in response to reduced gas pressure within manifold 12. Manifold 12 is connected to a remote air pump through vacuum ports 44 secured in barb fittings 42. The remote air pump is effective to evacuate vacuum chamber 20 and to reduce gas pressure within manifold 12 to produce a gas flow through manifold bores 28.

Vacuum pickup tool 10 further comprises a retaining plate 14 that overlies inner face 24 of carrier plate 22. Retaining plate 14 is affixed to manifold 12 by wedging retaining plate 14 and stencil 16 between manifold 12 and carrier plate 22 and attaching carrier plate 22 to manifold 12 with screws 40. Retaining plate 14 comprises a series of retaining plate bores 30 that are formed in a regular array and register with manifold bores 28. In a preferred embodiment, retaining plate bores 30 are larger than manifold bores 28 to assure communication despite variations in alignment. By way of an example of a preferred embodiment, retaining plate bores 30 have a diameter of about 0.66 millimeters. Retaining plate 14 is effective to secure a stencil 16 between carrier plate 22 and retaining plate 14.

In a preferred embodiment, stencil 16 is formed of a gas-impermeable material, such as a metallic foil, and is wedged between carrier plate 22 and retaining plate 14. In areas that are not part of a desired pattern, stencil 16 prevents gas flow created by reduced pressure in vacuum chamber 20 between a manifold bore and the corresponding retaining plate bore. Stencil 16 has a plurality of stencil holes 32 that are a subset of bores 28 and 30 and correspond to the desired pattern. Stencil holes 32 allow communication between manifold bores 28 and corresponding retaining plate bores 30 to form continuous gas passages that are effective to draw solder balls 18 into contact with concave seat 34.

FIG. 3 depicts a bottom plan view of a preferred stencil 16. Stencil 16 has a plurality of stencil holes 32 formed therein. Stencil holes 32 have a preferred diameter at least as large as the diameter of the manifold bores. By way of an example of a preferred embodiment, stencil holes 32 have a diameter of about 0.66 millimeters and are formed in the desired pattern. Alternate stencils can be used to come up with different pickup patterns. The interchangeability of stencils allows for a variety of patterns to be achieved by replacing a first stencil with a second stencil. This allows a flexible, inexpensive alternative to replacing the carrier plate and the retaining plate.

In a preferred operation, a stencil having holes in a desired pattern is fabricated. Stencil holes are formed, preferably by punching or other suitable methods, in areas where a solder ball is desired to be deposited onto a bond pad on a printed circuit board. Areas where no solder ball is desired remain intact and gas-impermeable to block the gas flow such that no solder ball is carried at that location. The stencil is interposed between the carrier plate and the retaining plate to assure a good seal in carrying balls in the desired pattern. In this manner, changes in the desired pattern result only in changes to the stencil. This allows quick turnaround time in pickup pattern reconfiguration without having to replace the carrier plate or the retaining plate.

The manifold bores and the retaining plate bores are formed in a regular array. Any subset of the array is capable of being formed by changing the stencil to selectively pick up a plurality of solder balls. A first array may be an aperiodic array that is a subset of the regular array. A foil is constructed to match the aperiodic array and is interposed between the carrier plate and the retaining plate. Solder balls are picked up in the first array and are deposited onto bond pads on a printed circuit board. When a second array is desired, for instance when a perimeter array die is desired, the screws are removed and the carrier plate is disengaged from the manifold. The retaining plate is removed from the manifold, a second stencil that matches the second array replaces the first stencil, and the retaining plate is replaced on the carrier plate. The carrier plate is then reattached to the manifold with the screws. In this manner, solder balls can be picked up and placed onto bond pads on a printed circuit board that match the second array.

The present invention provides a vacuum pickup tool that comprises a foil stencil interposed between a carrier plate and a retainer plate. The foil is gas-impermeable and includes holes that register with manifold bores and retaining plate bores to form continuous gas passages in a pattern. A vacuum chamber is evacuated and the reduced, sub-ambient gas pressure allows the pickup tool to pick up solder balls in the pattern. The pickup tool carries the solder balls to a substrate and deposits them onto bond pads in a pattern matching that of the solder bumps on a desired integrated circuit die. The foil is easily customized and changed, thereby alleviating the need to replace the carrier plate and the retaining plate, which is a costly and time-consuming process. In this manner, only the foil needs to be replaced when the pattern changes, thereby producing a large saving in cost and time. New carrier plates and retaining plates do not need to be tooled to form the new pattern, which is a subset of a regular array. It is easy and expedient to switch from one pattern to another by replacing the stencil. This avoids having to fabricate a customized manifold each time a new solder bump pattern is desired.

While this invention has been described in terms of certain examples thereof, it is not intended that it be limited to the above description, but rather only to the extent set forth in the claims that follow.

The embodiments of this invention in which an exclusive property or privilege is claimed are defined as follows:

1. A vacuum pickup tool for carrying balls arranged in a desired pattern, the vacuum pickup tool comprising:

a manifold defining a vacuum chamber and comprising a carrier plate having an inner face adjacent to the vacuum chamber and an outer face, said manifold further comprising a plurality of manifold bores arranged in a pattern at the outer face, each manifold bore being sized and shaped to retain a ball in response to reduced gas pressure within the vacuum chamber; and a retaining plate overlying the inner face and comprising a plurality of retaining plate bores arranged in a pattern such that each retaining plate bore registers with a corresponding manifold bore, said retaining plate being effective to secure a stencil formed of a gas-impermeable foil against the inner face to prevent gas flow between a manifold bore and a corresponding retaining plate bore.

2. A vacuum pickup tool in accordance with claim 1, further comprising means for evacuating the vacuum chamber.

3. A vacuum pickup tool in accordance with claim 1, wherein the retaining plate secures a stencil that includes a plurality of holes, the holes registering with the manifold bores and the retaining plate bores to form a plurality of continuous gas passages.

4. A vacuum pickup tool for carrying balls arranged in a desired pattern, the vacuum pickup tool comprising:

a manifold defining a vacuum chamber and comprising a carrier plate having an inner face adjacent to the vacuum chamber and an outer face, said manifold further comprising a plurality of manifold bores arranged in a pattern at the outer face, each manifold bore being sized and shaped to retain a ball in response to reduced gas pressure within the vacuum chamber;

a retaining plate overlying the inner face and comprising a plurality of retaining plate bores arranged in a pattern such that each retaining plate bore registers with a corresponding manifold bore; and a stencil interposed between said manifold and said retaining plate, said stencil being formed of a gas impermeable foil sufficient to prevent gas flow between each of the retaining plate bores and a corresponding manifold bore, said stencil defining a plurality of holes disposed such that the holes register with a subset of the manifold bores and the corresponding retaining plate bores to form continuous gas passages in the desired pattern.

5. A vacuum pickup tool in accordance with claim 4, wherein the stencil is formed of a metal foil.

6. A vacuum pickup tool in accordance with claim 4, further comprising means for evacuating the vacuum chamber.

7. A vacuum pickup tool in accordance with claim 4, wherein the manifold bores are arranged in a regular array.

8. A vacuum pickup tool in accordance with claim 7, wherein the plurality of holes are arranged in an aperiodic array.

9. A vacuum pickup tool for carrying solder balls arranged in a desired pattern, the vacuum pickup tool comprising:

a manifold defining a vacuum chamber and comprising a carrier plate having an inner face adjacent to the vacuum chamber and an outer face, said manifold further comprising a plurality of manifold bores arranged in a pattern at the outer face, each manifold bore comprising a concave seat at the outer face that is sized and shaped to receive a solder ball in response to reduced gas pressure within the vacuum chamber, the solder ball being effective to block air flow within the manifold bore;

a retaining plate overlying the inner face and comprising a plurality of retaining plate bores arranged in a pattern such that each retaining plate bore registers with a corresponding manifold bore; and a stencil interposed between said manifold and said retaining plate, said stencil being formed of a gas impermeable foil sufficient to prevent gas flow between each of the retaining plate bores and a corresponding manifold bore, said stencil defining a plurality of holes disposed such that the holes communicate with a portion of the manifold bores and the corresponding retaining plate bores to form continuous gas passages in the desired pattern.

10. A vacuum pickup tool in accordance with claim 9, further comprising means for evacuating the vacuum chamber.

11. A vacuum pickup tool in accordance with claim 9, wherein the manifold bores are arranged in a regular array.

12. A vacuum pickup tool in accordance with claim 11, wherein the plurality of holes are arranged in an aperiodic array.

* * * * *